(12) United States Patent
Yun et al.

(10) Patent No.: US 8,748,902 B2
(45) Date of Patent: Jun. 10, 2014

(54) LIGHT-EMITTING DIODE DEVICE GENERATING LIGHT OF MULTI-WAVELENGTHS

(75) Inventors: Hyo Chul Yun, Seoul (KR); Geum Jae Jo, Gyeonggi-do (KR); Young Chun Kim, Gyeonggi-do (KR); Dong Hyun Cho, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/106,545

(22) Filed: May 12, 2011

(65) Prior Publication Data

US 2011/0273083 A1 Nov. 10, 2011

Related U.S. Application Data

(63) Continuation of application No. 11/621,493, filed on Jan. 9, 2007, now Pat. No. 7,965,036.

(30) Foreign Application Priority Data

Jan. 9, 2006 (KR) .................. 10-2006-0002374

(51) Int. Cl.
*H01L 31/12* (2006.01)

(52) U.S. Cl.
USPC .................. 257/79; 257/82; 257/88

(58) Field of Classification Search
CPC ........... H01L 2224/73265; H01L 2224/48247; H01L 33/486; H01L 33/20; H01L 2224/32245; H01L 33/54; H01L 33/0079; H01L 2224/32225; H01L 33/507; H01L 2224/97; H01L 33/50; H01L 33/502; H01L 2224/49107; H01L 24/97
USPC ........... 313/498–512; 257/E33.061, E33.066, 257/13, E33.067, E33.001, E33.005, 257/E33.074, E33.008, E33.06, E33.062, 257/72, E33.012–E33.013, E25.028, 257/E33.006, E21.09, 14, E33.004, 257/E33.049, 615, 690, 200, 201, 290, 9, 257/43, 79–103, E33.016, E33.61, E33.055
See application file for complete search history.

(56) References Cited

U.S. PATENT DOCUMENTS 6,831,302 B2 * 12/2004 Erchak et al. .................... 257/87
2002/0105080 A1 * 8/2002 Speakman .................... 257/749
(Continued)

FOREIGN PATENT DOCUMENTS

| JP | 62-232943 A | 10/1987 |
| JP | 08-139189 A | 5/1996 |

(Continued)

OTHER PUBLICATIONS

Japanese Office Action, with English Translation, issued in Japanese Patent Application No. 2007-000456, dated May 31, 2010.

(Continued)

*Primary Examiner* — Anh Mai
*Assistant Examiner* — Fatima Farokhrooz
(74) *Attorney, Agent, or Firm* — McDermott Will & Emery LLP

(57) ABSTRACT

The present invention relates to a method of manufacturing an LED device which emits light of multi-wavelengths. The invention also relates to a method of manufacturing LED devices which emit light of high quality from throughout the whole surface in a uniform manner. In particular, utilizing the manufacturing method of LED devices which emit light of multi-wavelengths makes it possible to produce LED devices of high quality in a simple and cost-efficient way, not by using adhesives, but by a sputtering or PLD method. In addition, since the characteristics of the desired emitted light can be controlled by controlling the amount and type of the phosphors during the manufacture of sputtering targets, high quality LED devices can be manufactured easily.

12 Claims, 4 Drawing Sheets

(56) References Cited

U.S. PATENT DOCUMENTS

| | | | |
|---|---|---|---|
| 2004/0124422 A1 | 7/2004 | Sakamoto et al. | |
| 2004/0245532 A1 | 12/2004 | Maeda et al. | |
| 2005/0006659 A1 | 1/2005 | Ng et al. | |
| 2005/0077531 A1* | 4/2005 | Kim | 257/98 |
| 2005/0112886 A1 | 5/2005 | Asakawa et al. | |
| 2005/0184651 A1 | 8/2005 | Cheng et al. | |
| 2005/0224812 A1* | 10/2005 | Liu et al. | 257/79 |
| 2005/0227569 A1 | 10/2005 | Maeda et al. | |
| 2005/0245532 A1 | 11/2005 | Hoff et al. | |
| 2005/0253158 A1 | 11/2005 | Yasukawa et al. | |
| 2005/0281304 A1 | 12/2005 | Mochida | |
| 2006/0006408 A1* | 1/2006 | Suehiro et al. | 257/103 |
| 2006/0054913 A1 | 3/2006 | Hadame et al. | |
| 2006/0102915 A1* | 5/2006 | Kim | 257/98 |

FOREIGN PATENT DOCUMENTS

| | | |
|---|---|---|
| JP | 11-046015 A | 2/1999 |
| JP | 2000-17344 A | 6/2000 |
| JP | 2002-033521 | 1/2002 |
| JP | 2002-118293 | 4/2002 |
| JP | 2002-324915 | 11/2002 |
| JP | 2003-046134 | 2/2003 |
| JP | 2003-258296 | 9/2003 |
| JP | 2004-056109 A | 2/2004 |
| JP | 2004-266240 | 9/2004 |
| JP | 2004-363342 | 12/2004 |
| JP | 2004-363382 | 12/2004 |
| JP | 2005-033138 | 2/2005 |
| JP | 2005-072527 | 3/2005 |
| JP | 2005-116998 | 4/2005 |
| JP | 2005-123560 | 5/2005 |
| JP | 2005-142315 A | 6/2005 |
| JP | 2005-150261 | 6/2005 |
| JP | 2005-259970 A | 9/2005 |
| JP | 2007-073733 | 3/2007 |
| JP | 2008-527720 | 7/2008 |
| WO | WO-03/032407 A1 | 4/2003 |
| WO | WO 2005/048361 A3 | 5/2005 |
| WO | WO-2005-112136 A1 | 11/2005 |

OTHER PUBLICATIONS

Japanese Office Action. w/ English translation thereof, issued in Japanese Patent Application No. JP 2007-000456 dated Feb. 8, 2011.

Japanese Office Action, and English translation thereof, issued in Japanese Patent Application No. 2010-175622 dated Oct. 18, 2010.

Japanese Office Action, and English translation thereof, issued in Japanese Patent Application No. 2007-000456 dated Jul. 24, 2012.

* cited by examiner

LIGHT-EMITTING DIODE DEVICE GENERATING LIGHT OF MULTI-WAVELENGTHS

RELATED APPLICATIONS

This application is a Continuation of U.S. patent application Ser. No. 11/621,493, filed on Jan. 9, 2007, claiming priority of Korean Application No. 10-2006-0002374, filed on Jan. 9, 2006 now U.S. Pat. No. 7,965,036, the disclosures of which Applications are incorporated by reference herein.

BACKGROUND OF THE INVENTION

Field of the Invention

The present invention relates to a method of manufacturing a light-emitting diode device, more specifically, to a method of manufacturing an LED device which generates light of multi-wavelengths.

The application of LED devices is continuously expanding. For example, white LED devices have been utilized in a wide variety of signal devices as well as devices for white light including display devices, or electrical appliances such as fluorescent lamps. LED devices other than white LED devices, which emit light of different wavelengths, are also widely utilized in various applicable fields.

It is possible to manufacture LED devices which emit light of a particular wavelength, for example, in such a manner that the LED chip itself emits light of a characteristic wavelength. However, manufacture of such LED chips is restricted in many ways in terms of emitted light characteristics, manufacturing technology, and light efficiency. As an alternative, there has been extensive research on methods of manufacturing LED devices which emit light of multi-wavelengths such as white, blue, green, yellow, or red light using a high quality LED chip that emits light of short wavelengths.

This kind of LED device generates light of single or multi-wavelengths such as white light or light of multi-wavelengths by phosphor-converting a portion of the light emitted from a blue or ultraviolet LED chip into light of longer wavelengths. These LED devices perform phosphor-conversion of a portion of the light emitted from the LED chip using phosphors. Variation of the phosphors in type and/or amount can produce various lights of short wavelengths or light of multi-wavelengths as a combination of these lights.

FIGS. 1a and 1b show an example of a white LED device of conventional technology. FIG. 1a shows a lamp-type white LED device, and FIG. 1b shows a white LED device where an LED chip is packaged in a resin mold.

FIGS. 1a and 1b display an ultraviolet (UV) or blue light-emitting LED chip (120) disposed on printed substrate (130) by using an adhesive (122). Molding resin (110) in which phosphors (112) are dispersed, covers and protects the LED chip (120). An electrode pad is connected to an outer conductor, i.e. a lead frame (132) through a bonding wire (124), which supplies power to the LED chip (120).

A common characteristic of the LED devices shown in FIGS. 1a and 1b is that phosphors (112) are uniformly dispersed within the molding resin (112). In other words, a portion of the ultraviolet (UV) or blue light emitted from the LED chip (120) is phosphor-converted to light of longer wavelengths through the phosphors (112) dispersed within the molding resin (112) and white light is emitted as a result of the phosphor-converted light combining with the unconverted portion of the light of longer wavelengths.

In order to obtain white light of high quality from an LED device of this type of structure, phosphors must be uniformly dispersed throughout the whole resin. However, in conventional manufacturing processes of LED devices, it is difficult to obtain phosphor particles which are uniform in size, and to obtain uniform spatial dispersion of phosphors, because the specific gravity of phosphors is greater than that of molding resin.

A recent LED device presented to overcome the aforementioned problem is described in PCT/US2000/26507 (Publication No. WO2001/24285). A side view of the device in the aforementioned document is shown in FIG. 2.

The LED device in FIG. 2 shows a phosphor conversion substrate (230) consisting of single crystal phosphors on one side of the light-emitting structure (210). A light-emitting structure (210) may be comprised of, for example, n-GaN layers (211, 212) which are n-electrodes, n-AlGaN layer, SQW or MWQ GaInN layer (213), p-AlGaN layer (214), and p-GaN layer (215), above which a p-electrode (216) may be disposed. A phosphor-conversion substrate may be comprised of a compound which includes a single-crystal phosphor.

Thus, the aforementioned example contains phosphors in the substrate to produce white light or light of different wavelengths, and the characteristics of this substrate can be precisely controlled. Ultraviolet (UV) or blue light emitted by the LED chip is reflected directly or through a reflector and passes through this phosphor-conversion substrate (230), upon which a portion of the light may be converted to light of another wavelength, ultimately to produce light of longer wavelengths or white light. Furthermore, this substrate also acts as a seed that promotes the single crystalline growth of the light-emitting structure of the LED chip.

The present invention provides an LED device which emits light of multi-wavelengths such as white light, various single wavelength lights, or a mixture of these single wavelength lights, using an ultraviolet (UV) or blue light-emitting LED chip.

Also, the present invention provides a method of manufacturing LED devices which emit light of multi-wavelengths which does not use adhesives, that saves manufacturing cost through a simplified process, as well as having good light emission characteristics.

SUMMARY OF THE INVENTION

The present invention has met the hereinbefore described need.

The present invention relates to a method of manufacturing a light-emitting diode (LED) device which generates light of multi-wavelengths such as white light, blue-green light, or pink light, using blue LED chips or ultraviolet LED chips. An embodiment of the present invention involves forming a mask pattern to mask the electrode pad on the LED chip, and deposit a phosphor layer on the LED chip thinly and uniformly using pulsed DC sputtering method, pulsed RF sputtering method, or pulsed laser deposition (PLD) method. In the sputtering or PLD method, a target of such processes as a sputtering process is made by using either $SiO_2$ or SiO mixed with phosphors, then the target is used to deposit a phosphor layer. After a phosphor layer is deposited, the mask pattern is eliminated. In this way, the present invention manufactures an LED device which generates light of multi-wavelengths.

These and other objects of the invention will be more fully understood from the following description of the invention, the referenced drawings attached hereto and the claims appended hereto.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
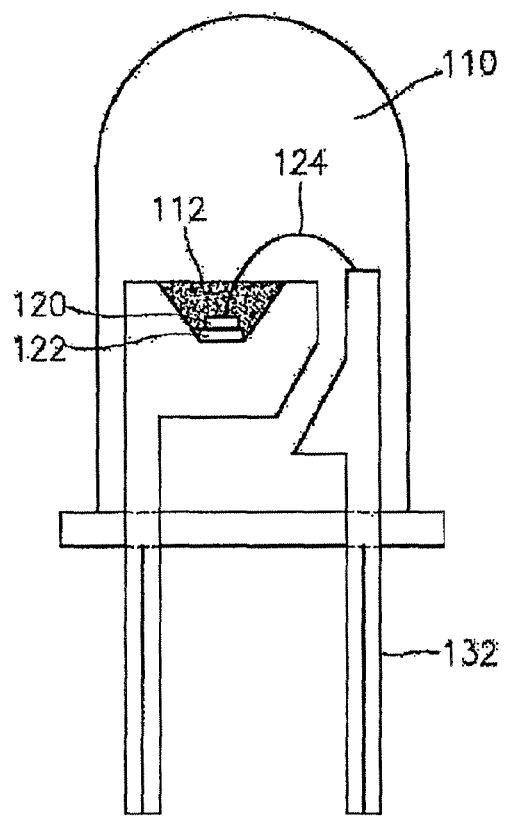
FIGS. 1a and 1b are overall sectional views of examples of white LED devices according to conventional technology.
Figure 1B:
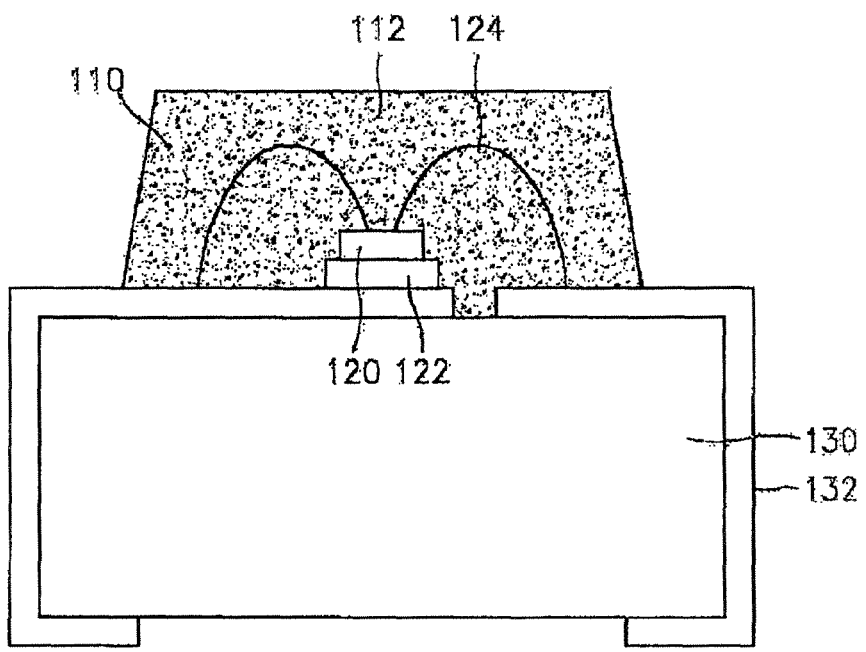
Figure 2:
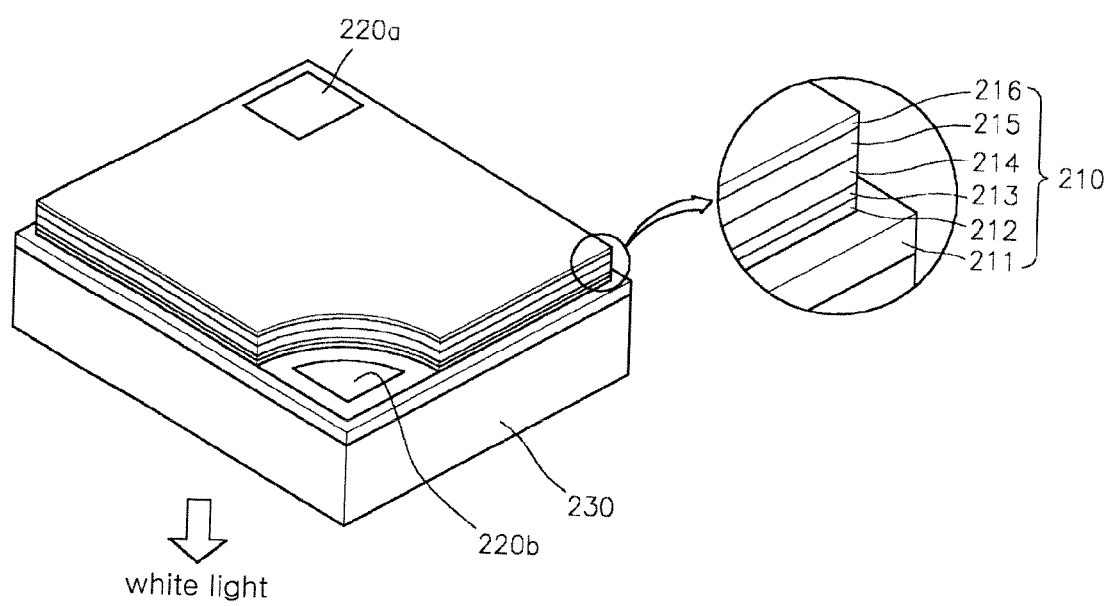
FIG. 2 is an overall sectional view, which illustrates another example of a white LED device according to conventional technology.

The present invention relates to a manufacturing method of LED devices which contain phosphors that convert the whole or a portion of the primary light emitted from an LED chip to light of one or more other wavelengths.

In a manufacturing method of the LED device according to an embodiment of the present invention, a mask pattern which masks electrode pads on an LED chip is first formed, and a phosphor layer is formed on the LED chip by depositing target substances which include phosphors on the LED chip using a sputtering method or pulsed laser deposition method, then the aforementioned mask pattern on the LED chip is eliminated, producing an LED device where a phosphor layer is thinly disposed on the light-emitting side of the LED chip. It is possible to manufacture these LED devices which emit light of various desired wavelengths, light of multi-wavelengths, or white light by controlling the type and amount of the phosphors contained in the target substances.

A manufacturing method of the LED device according to another embodiment of the present invention forms a phosphor layer on the LED chip by depositing a target substance which include phosphors, on the side that is opposite of the electrode pad forming face of the LED chip by sputtering or PLD methods, to adhere the electrode pad forming face of LED chip to the substrate by flip chip method. In this method, it is also possible to manufacture these LED devices which emit light of the desired wavelengths, light of multi-wavelengths, or white light by varying the type and amount of the phosphors contained in the target substances.

According to one aspect of the above-mentioned embodiments, the target substances preferably contain at least one of oxides which include $SiO_2$, $SiO$, $Al_2O_3$, or $ZnO$; nitrides which include $SiN$, $AlN$, $GaN$, or $InN$; epoxy; or silicon. When nitrides which contain $SiN$, $AlN$, $GaN$, or $InN$ are used, it has the notable advantage of enhancing the efficiency of extracting light, by reducing internal reflection caused by a difference in refractive index, because nitrides have the same or similar characteristics to $(Al,In)GaN$. Furthermore, in case of using a sputtering method, pulsed DC power or RF power may be used as the power source.

According to another aspect of the above-mentioned embodiments, the LED chip may be an ultraviolet light-emitting chip or a blue light-emitting chip. In the case of using an ultraviolet (UV) light-emitting LED chip, the light emitted from the LED device may be blue light, green light, yellow light, red light, or a combination thereof as well as white light.

On the other hand, in the case of using a blue LED chip, the light emitted from the LED device may be green light, yellow light, red light, or a combination thereof as well as white light.

A detailed description of the invention follows with reference to the Figures. However, the present invention is not limited to the examples illustrated here, but can be embodied in other forms. Rather, the examples introduced here are presented in order to fully convey the idea of the present invention to those skilled in the art. In the Figures, the thickness of the layers is exaggerated for clarity. Identical reference numbers throughout the description indicate identical components.

Figure 3A:
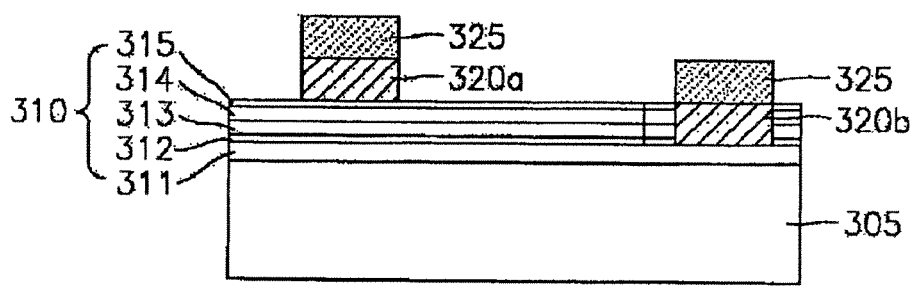
FIGS. 3a and 4a show side views, which describe an example of the method of manufacturing an LED device which generates light of multi-wavelengths according to the present invention.
Figure 3B:
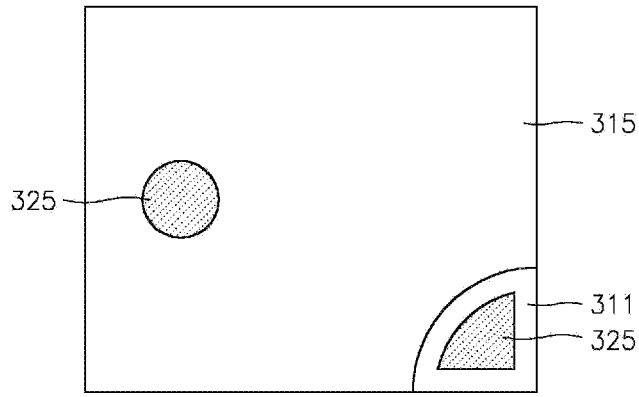
FIGS. 3b and 4b are plane views, which describe an example of the method of manufacturing an LED device which generates light of multi-wavelengths according to the present invention.
Figure 4A:
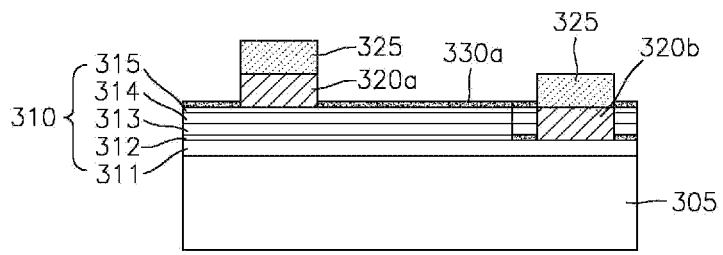
Figure 4B:
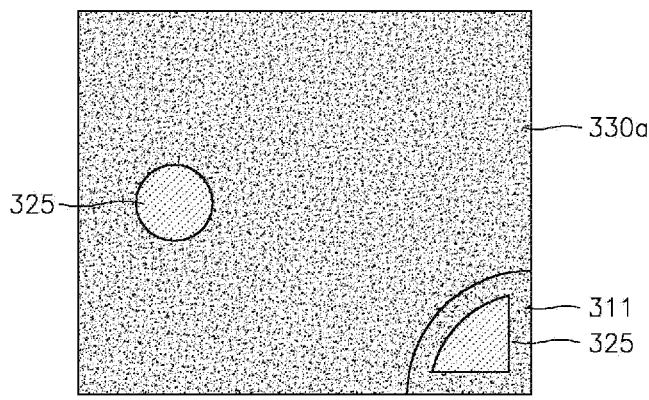

FIGS. 3a, 3b, 4a, and 4b demonstrate a manufacturing method of LED devices which emit light of multi-wavelengths according to a preferred embodiment of the present invention. Although the manufacturing process described herein is carried out on bulk substrate where a great number of LED chips are arrayed, FIGS. 3a, 3b, 4a, and 4b display a single chip for the sake of simplicity of explanation. FIGS. 3a and 4a are side views of a single chip, whereas FIGS. 3b and 4b are plane views.

In FIGS. 3a and 4a, the LED chip structure, i.e. the light-emitting structure is disposed on a substrate (305). The substrate (305) may be either silicon or aluminum oxide ($Al_2O_3$). A semiconductor layer (311) is doped in an n-type or p-type, and then the light-emitting layer (313) and n-type or p-type substance (314) are formed in sequence. The order of lamination of n-type and p-type semiconductor layers may be changed. However, the light-emitting layer is preferably sandwiched in between an n-type and a p-type semiconductor layers. A transparent electrode layer (315) is formed on the surface of the n-type or p-type conductive layer. The n-type and p-type multi-layer (312) may be located anywhere either under or over the light-emitting layer, and be formed on the surface of light-emitting diode devices in various structures such as concave-convex structures or particle-shaped scattering layers on the surface or side of the LEDs, to enhance efficiency in light emission.

The light-emitting structure is a structure which emits ultraviolet (UV) light or blue light.

The present invention is not limited to the types of LED chips illustrated in the Figures. An illustrated LED chip merely exemplifies one embodiment. That is, the present invention encompasses any LED chip as long as it has a light-emitting structure and an electrode pad to externally connect to this light-emitting structure.

To produce such LED devices which emit light of multi-wavelengths using this type of LED chip, a mask pattern (325) is formed on one side of the LED chip. This mask pattern (325) is a layer which masks specific portions where phosphor layers must not be deposited, such as on the electrode pads (320a, 320b). Although photoresists (PR) are preferably used for the mask pattern (325), an insulating layer such as an oxide or nitride layer may be utilized. Using PR for a mask pattern (325) is convenient because it enables use of the photolithography process which is commonly employed in semiconductor manufacturing processes.

In FIGS. 4a and 4b, a process of forming a phosphor layer on the surface of an LED chip is carried out. In other words, a phosphor layer of a particular thickness is formed on the surface of the LED chip except for the electrode pads masked by the mask pattern (325). In case of the phosphor layer (330) formed on the surface of the LED chip, the phosphor can be dispersed and deposited on the LED chip thinly and uniformly, and also the amount of the phosphors to be deposited can be appropriately controlled. Therefore, the present process can produce LED devices which emit light of desired wavelengths resulting in desired colors, as well as having uniform light characteristics.

A phosphor layer (330) may be formed by a sputtering method or pulsed laser deposition (PLD) method. The present invention does not employ adhesives to dispose phosphors or substances which contain phosphors, but applies a certain degree of physical or chemical energy to form phosphors or phosphor-containing substances directly onto the surface of the LED chip. Therefore, it overcomes the disadvantage of inefficiency in light emission from LED chip manufacture methods which use adhesives.

When sputtering methods are used, pulsed DC power or RF power may be used as the power supply. For instance, incase of forming a phosphor layer (330) using a sputtering method, it is possible to produce a target of the sputtering process, by using a phosphor mixed with at least one of oxides including $SiO_2$, SiO, Copper Indium Oxide (CIO), Indium Tin Oxide (ITO), Indium Oxide (IO), $Al_2O_3$, or ZnO; nitrides including SiN, AlN, GaN, or InN; epoxy; or silicon. Furthermore, a phosphor layer is formed directly on the surface of the LED chip when the sputtering process is performed using this target. A target of this type of sputtering process can be manufactured by sintering or molding the aforementioned target substance into a two-inch tablet.

Either YAG compounds or non-YAG compounds may be utilized as phosphors contained in this target. Non-YAG compounds include garnet compounds, silicate compounds, nitrides, or sulfides. TAG represents a non-YAG compound among garnet compounds, and Y of YAG and Tb of TAG can be substituted by Lu, Sc, La, Gd, Sm, Ca, Si, and so forth. Silicate compounds include (Sr, Ba, Ca, Mg, Zn, Cd, Y, Sc, La)$_x$Si$_y$O$_z$:(Eu, F, Mn, Ce, Pb), and the elements in the parentheses may be used in combination or alone (0≤x, y, z≤16). Phosphoric substances comprised of $Ca_x(Si,Al)_{12}(O,N)_{16}$ may be utilized for nitride or sialon compounds. Here, $Ca_x$ can be substituted by another metal element, and its activators include one or more of Eu, Pr, Tb, Yb, Er, or Dy. Sulfide phosphors may include at least one of (Ca, Sr)S, $SrGa_2S_4$, (Ca, Sr, Ba)(Al, Ca)$_2S_4$, (Sr, Mg, Ca, Ba)(Ga, Al, In)$S_4$, or $Y_2O_2S$. And Eu, Ce, and so forth may be used as activators. Different elements in parentheses of the above-mentioned chemical formulae are used depending on the wavelength coverage desired.

Furthermore, various kinds of phosphors may be used depending on the type of the LED chip used and the desired wavelength of light. For example, in case of using an ultraviolet (UV) light-emitting LED chip, appropriate phosphors may be selected to emit light of a desired color which may be produced by a combination of one or more of green light, yellow light or red light, in accordance with the desired wavelength of light. Also, in the case of a blue light-emitting LED chip, phosphors may be selected to produce light of a desired color which may be produced by a combination of one or more of green light, yellow light or red light, in accordance with the desired wavelength of light.

For example, at least one or more combination of $BaMgAl_{10}O_{17}$:Eu, $Sr_5(PO_4)_3$Cl:Eu, and ZnS:Ag may be used for blue light-emitting phosphors.

At least one or more combination of sulfide phosphors including ZnS:Cu, (Ca, Sr)S:Eu, silicate phosphors including (Sr, Ba, Ca, Mg, Zn, Cd, Y, Sc, La)$_x$Si$_y$O$_z$:(Eu, F, Mn, Ce, Pb), or $BaMgAl_{10}O_{17}$:Eu, Mn may be used for green light-emitting phosphors. At least one or more combination among garnet compounds including YAG compounds and TAG compounds, and silicate compounds may be used for yellow light-emitting phosphors. At least one or more combination among sulfides such as $Y_2O_2S_2$, nitrides, $YVO_4$:Eu$^{3+}$, Y(V, P, B)$O_4$: Eu$^{3+}$, $YNbO_4$:Eu$^{3+}$, or $YTaO_4$:Eu$^{3+}$ may be used for red light-emitting phosphors.

Further, elimination of the mask pattern (325) formed on upper parts such as the electrode pads (320a, 320b) produces the LED device illustrated in FIGS. 4a and 4b.

Figure 5:
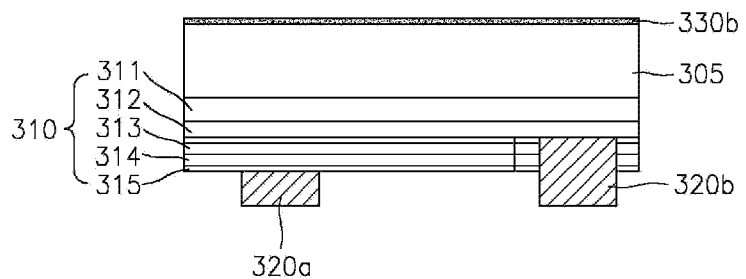
FIG. 5 is a side view, which describes another example of the method of manufacturing an LED device which generates light of multi-wavelengths according to the present invention.

FIG. 5 shows a side view of the LED device manufactured in accordance with another preferred embodiment of the present invention.

A distinctive feature of one of the presently exemplified device is that a phosphor layer is formed on the backside of the LED chip, i.e. the opposite side of where the electrode pads (320a, 320b) are formed, in the manufacturing process of LED devices which emit light of multi-wavelengths, utilizing disposition on the substrate in a flip chip method. Thus, this exemplified device does not need a mask pattern (325) since a phosphor layer (330b) is disposed over the whole back side of the LED chip.

Therefore, a mask pattern forming process which uses photoresist is not necessary in this example. However, there may be other components wherein a phosphor layer must not be formed, similar to the case where a phosphor layer is formed on the back side of an LED chip. In this case, an LED device manufacturing process may be carried out in the same manner as in the above-described example.

The present invention is not to be limited in scope by the specific embodiments described herein. Indeed, various modifications of the invention in addition to those described herein will become apparent to those skilled in the art from the foregoing description and accompanying figures. Such modifications are intended to fall within the scope of the appended claims. The following examples are offered by way of illustration of the present invention, and not by way of limitation.

All of the references cited herein are incorporated by reference in their entirety.

Those skilled in the art will recognize, or be able to ascertain using no more than routine experimentation, many equivalents to the specific embodiments of the invention specifically described herein. Such equivalents are intended to be encompassed in the scope of the claims.

What is claimed is:

1. An LED device, comprising:
   a first type semiconductor layer;
   a light-emitting layer disposed on the first type semiconductor layer;
   a second type semiconductor layer disposed on the light-emitting layer, wherein the second type semiconductor layer and the light-emitting layer have truncated portions along a side surface of the second type semiconductor layer and a side surface of the light-emitting layer, the truncated portions having an exposed surface of the first type semiconductor layer;
   a first electrode pad having upper and sidewall surfaces, disposed on one of the first type semiconductor layer, the light-emitting layer, and the second type semiconductor layer, for an external electrical connection of the LED device; and
   a phosphor layer, which converts primary light emitted from the light-emitting layer to light of one or more different wavelengths, overlying an area of the second type semiconductor layer and the exposed surface of the first type semiconductor layer in the truncated portions, other than the upper surface of the first electrode pad, wherein the phosphor layer is not disposed on a side surface of the truncated portions, the side surface of the truncated portions extending between a top surface of the first type semiconductor layer and a top surface of the second type semiconductor layer.

2. The LED device of claim 1. wherein the area of the second semiconductor layer, where the phosphor layer does not overlie, has a circular, a circular-sector, or a polygonal shape.

3. The LED device of claim 1, wherein the phosphor layer comprises at least one of $BaMgAl_{10}O_{17}$:Eu, $Sr_5(PO_4)_3Cl$:Eu, and ZnS:Ag.

4. The LED device of claim 1, wherein the phosphor layer comprises at least one of ZnS:Cu, (Ca, Sr)S:Eu, (Sr, Ba, Ca, Mg, Zn, Cd, Y, Sc, La)$_x$Si$_y$O$_z$:(Eu, F, Mn, Ce, Pb), and $BaMgAl_{10}O_{17}$:(Eu. Mn), wherein x, y, and z are in a range of 0 through 16, and one or more elements in the parentheses is combined therewith.

5. The LED device of claim 1, wherein the phosphor layer comprises atast le one of nitride, sulfide, $Y_2O_2S$, and Y(V, P, B, Nb, Ta)$O_4$:Eu$^{3+}$.

6. The LED device of claim 1, wherein the phosphor layer comprises at least one of $SiO_2$, SiO, nitride, epoxy, and silicon.

7. The LED device of claim 1, wherein the phosphor layer comprises at least one of $SiO_2$, SiO and nitride.

8. The LED device of claim 1, wherein the phosphor layer comprises at least one of blue light-emitting phosphor, green light-emitting phosphor, yellow light-emitting phosphor, and red light-emitting phosphor.

9. The LED device of claim 8, wherein the blue light-emitting phosphor comprises at least one of $BaMgAl_{10}O_{17}$:Eu, $Sr_5(PO_4)_3Cl$:Eu, and ZnS:Ag.

10. The LED device of claim 8, wherein the green light-emitting phosphor comprises at least one of ZnS:Cu, (Ca, Sr)S:Eu, (Sr, Ba, Ca, Mg, Zn, Cd, Y, Sc, La)$_x$Si$_y$O$_z$:(Eu, F, Mn, Ce, Pb), and BaMgAl10O17:(Eu, Mn), wherein x, y, and z are in a range of 0 through 16, and one or more elements in the parentheses is combined.

11. The LED device of claim 8, wherein the red light-emitting phosphor comprises at least one of nitride, sulfide, $Y_2O_2S$, and Y(V, P, B, Nb, Ta)$O_4$:Eu$^{3+}$.

12. The LED device of claim 1, wherein the upper surface of the phosphor layer outside of the first electrode pad is a portion of the phosphor layer immediately surrounding the first electrode pad.

\* \* \* \* \*